US005604698A

United States Patent [19]

Bergemont

[11] Patent Number: 5,604,698
[45] Date of Patent: Feb. 18, 1997

[54] VIRTUAL-GROUND FLASH EPROM ARRAY WITH REDUCED CELL PITCH IN THE X DIRECTION

[75] Inventor: Albert M. Bergemont, Santa Clara, Calif.

[73] Assignee: National Semiconductor Corporation, Santa Clara, Calif.

[21] Appl. No.: 631,824

[22] Filed: Apr. 10, 1996

Related U.S. Application Data

[63] Continuation of Ser. No. 531,015, Sep. 20, 1995, abandoned, which is a continuation of Ser. No. 213,215, Mar. 15, 1994, abandoned.

[51] Int. Cl.$^6$ .................................................. G11C 16/04
[52] U.S. Cl. ........................ 365/185.01; 365/185.16; 365/185.26; 365/185.27; 365/185.29; 365/230.06; 257/316
[58] Field of Search ........................... 365/185, 218, 365/185.01, 185.16, 185.26, 185.29, 185.27, 230.06; 257/316, 317

[56] References Cited

U.S. PATENT DOCUMENTS

| | | |
|---|---|---|
| 5,149,665 | 9/1992 | Lee . |
| 5,210,047 | 5/1993 | Woo et al. . |
| 5,241,193 | 8/1993 | Pfiester et al. ............................ 275/67 |
| 5,280,446 | 1/1994 | Ma et al. .................................. 365/185 |
| 5,326,999 | 7/1994 | Kim et al. ................................ 275/315 |
| 5,332,914 | 7/1994 | Hazani ..................................... 257/320 |
| 5,338,956 | 8/1994 | Nakamura ................................ 257/316 |

FOREIGN PATENT DOCUMENTS

| | | |
|---|---|---|
| 0255159 | 2/1988 | European Pat. Off. . |
| 0434121 | 6/1991 | European Pat. Off. . |
| 0573169 | 12/1993 | European Pat. Off. . |
| 0573170 | 12/1993 | European Pat. Off. . |
| 0573728 | 12/1993 | European Pat. Off. . |

OTHER PUBLICATIONS

U.S. application Ser. No. 07/988,293, Bergemont.
U.S. application Ser. No. 07/830,938, Bergemont.

*Primary Examiner*—Joseph E. Clawson, Jr.
*Attorney, Agent, or Firm*—Limbach & Limbach L.L.P.

[57] ABSTRACT

In a virtual-ground flash electrically programmable read-only-memory (EPROM), the pitch in the X direction of the floating gates, which are formed over a portion of vertically-adjacent field oxide regions, is reduced by forming the floating gates over continuous strips of vertically-adjacent field oxide. The strips of field oxide are formed in a layer of polysilicon which is formed over a layer of tunnel oxide which, in turn, is formed over the substrate.

11 Claims, 14 Drawing Sheets

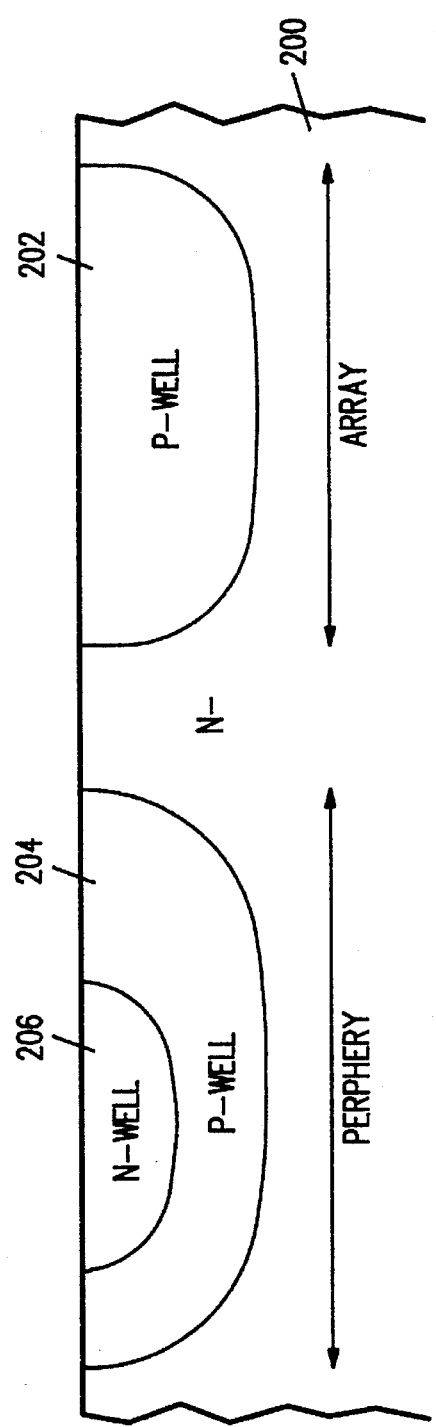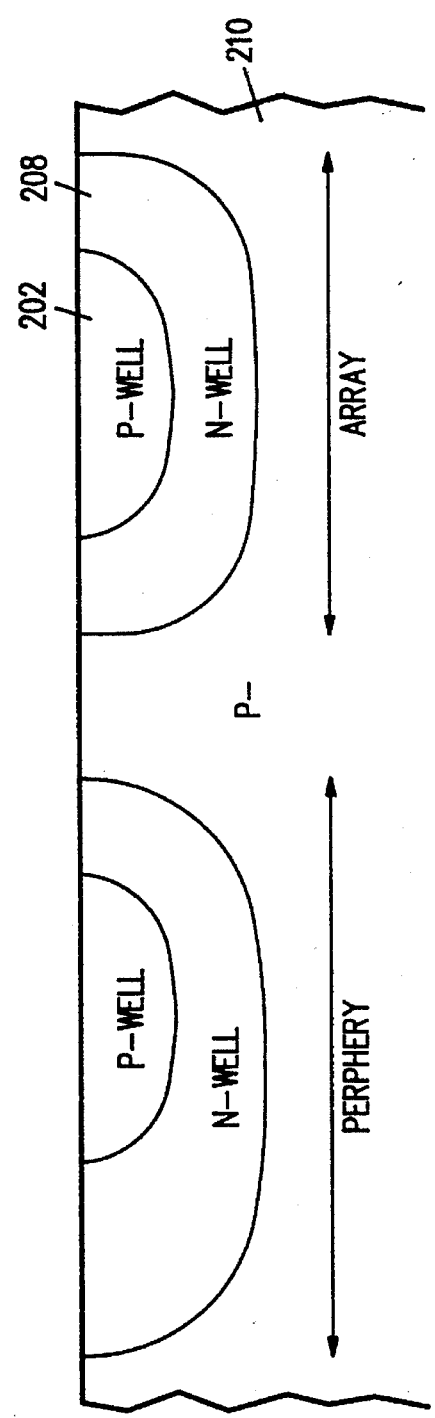
FIG. 2A
FIG. 2B

VIRTUAL-GROUND FLASH EPROM ARRAY WITH REDUCED CELL PITCH IN THE X DIRECTION

This is a continuation of application Ser. No. 08/531,015 filed on Sep. 20, 1995, now abandoned, which is a continuation of Ser. No. 08/213,215, filed Mar. 15, 1994, abandoned.

BACKGROUND OF THE INVENTION

1. Field of the Invention.

The present invention relates to electrically programmable read-only-memories (EPROMs) and, in particular, to a virtual-ground flash EPROM array that reduces the cell pitch in the X direction.

2. Discussion of the Related Art.

A flash electrically programmable read-only-memory (EPROM) is a non-volatile memory that, like conventional EPROMs and electrically-erasable programmable read-only-memories (EEPROMs), retains data which has been stored in the memory when power is removed and which, unlike conventional EPROMs and EEPROMs, can be selectively erased.

FIG. 1 shows a plan view that illustrates a portion of a "virtual-ground" flash EPROM array 10, such as the array described in U.S. application Ser. No. 07/988,293, filed by Albert Bergemont on Dec. 8, 1992, titled HIGH DENSITY CONTACTLESS FLASH EPROM ARRAY USING CHANNEL ERASE.

As shown in FIG. 1, array 10 includes a series of memory cells 12, a series of access transistors 14, and a series of field oxide regions FOX which separate both the vertically-adjacent memory cells and access transistors of the array. In addition, each memory cell 12 and each access transistor 14 in a column of memory cells and access transistors shares a source bit line SOURCE and a drain bit line DRAIN with the remaining memory cells and access transistors in the column, and with the memory cells 12 and access transistors 14 in the horizontally-adjacent columns.

Further, a series of metal bit lines MBL1-MBLn in FIG. 1 are utilized to contact the drain bit lines DRAIN so that each drain bit line DRAIN is contacted by one metal bit line MBL once every 64 cells. The source bit lines SOURCE, on the other hand, are not contacted by a metal bit line.

As also shown in FIG. 1, the memory cells 12 in a row of memory cells share a common word line 16. As is well known, the portion of the word line 16 which is formed over each memory cell 12 in a row of memory cells functions as the control gate of the memory cells in that row. Similarly, the access transistors 14 in a row of access transistors share a common access select line 18.

One of the major goals in the design of a virtual-ground flash EPROM is to reduce the area consumed by each cell of the array, thereby increasing the density of the array. Conventionally, the area of a cell is measured by the pitch of the cell in the X direction and the pitch of the cell in the Y direction.

The pitch of a cell in the X direction can be defined as the distance from one edge of a field oxide region to the same edge of a horizontally-adjacent field oxide region. Thus, as shown in FIG. 1, the X cell pitch can be defined by the distance $D_1$ which represents the length of a field oxide region FOX, and by the distance $D_2$ which represents the minimum spacing between horizontally-adjacent field oxide regions FOX.

The length of the field oxide regions FOX, in turn, is defined by the distance $D_3$, which represents the width of a floating gate, plus the distances $D_4$ and $D_5$, both of which represent a misalignment width. In a conventional virtual-ground flash EPROM fabrication process, the misalignment widths $D_4$ and $D_5$ are required to assure that the floating gates will be formed over a portion of each of the vertically-adjacent field oxide regions FOX even if the floating gates are slightly misaligned.

Thus, if the floating gates could be precisely positioned, the misalignment widths $D_4$ and $D_5$ could be eliminated, thereby substantially reducing the pitch of the cells in the X direction. Therefore, there is a need for a process which precisely positions the floating gates over a portion of each of the vertically-adjacent field oxide regions FOX.

SUMMARY OF THE INVENTION

In a virtual-ground flash electrically programmable read-only-memory (EPROM) array, the floating gate of each memory cell is formed over a portion of a pair of vertically-adjacent field oxide regions. The length of the field oxide regions in the X direction is defined by the width of the floating gate plus two misalignment widths which assure that the floating gate is formed over a portion of each of the vertically-adjacent field oxide regions even if the floating gate is slightly misaligned. The present invention provides a method for eliminating the misalignment widths by forming the floating gates over continuous strips of field oxide. The strips of field oxide are formed in a layer of polysilicon which is formed over a layer of tunnel oxide which, in turn, is formed over the substrate. By eliminating the misalignment widths, the pitch of the cells in the X direction can be significantly reduced.

In accordance with the present invention, a method of fabricating a virtual-ground flash electrically programmable read-only-memory (EPROM) begins by providing a semiconductor substrate with an N-type conductivity. Following this, a P-well region is formed in the semiconductor substrate. Next, the P-well region is implanted with a P-type dopant to set a channel threshold voltage. A layer of first dielectric material is then formed over the P-well, followed by the formation of an overlying layer of first conductive material. After this, a plurality of spaced-apart parallel strips of field oxide are formed in the layer of first conductive material. Once the strips of field oxide have been formed, a layer of second conductive material is formed over the strips of field oxide and the layer of first conductive material, followed by the formation of an overlying layer of second dielectric material. Following this, a plurality of first unmasked, spaced-apart parallel strips which are perpendicular to the strips of field oxide are defined on the layer of second dielectric material. Next, the layer of second dielectric material defined by the first unmasked strips, and the layer of second conductive material and the layer of first conductive material underlying the first unmasked strips are etched away to form a plurality of dielectric/conductive strips. As a result of this etching step, a plurality of regions of field oxide, and a plurality of first regions of first dielectric material are exposed. After this etching step, the P-well region is implanted through the regions of first dielectric material with an N-type dopant to form a plurality of first bit line regions. Next, a layer of third dielectric material is formed over the sidewalls of each dielectric/conductive strip, and the regions of first dielectric material. Following this, a layer of third conductive material is formed over the layer of third dielectric material, the regions of field oxide, and the layer of second dielectric material. Once the layer of third dielectric material has been formed, a plurality of second unmasked, spaced-apart parallel strips which are parallel to the strips of field oxide are defined on the layer of third conductive material. After this, the layer of third conductive material defined by the second unmasked strips, and the strips of field oxide and the layer of first conductive material underlying the second unmasked strips are etched away to form a plurality of word lines. As a result of this etching step, a plurality of second regions of first dielectric material are exposed. Next, a plurality of unmasked, spaced-apart regions are defined on the second regions of first dielectric material. Following this, the P-well region is implanted with an N-type dopant through the second regions of first dielectric material defined by the unmasked regions to form a plurality of second bit line regions. The plurality of first bit line regions and the plurality of second bit line regions are then diffused to form a plurality of bit lines. Following this, a layer of fourth dielectric material is formed over the second regions of first dielectric material.

A better understanding of the features and advantages of the present invention will be obtained by reference to the following detailed description and accompanying drawings which set forth an illustrative embodiment in which the principals of the invention are utilized.

BRIEF DESCRIPTION OF THE DRAWINGS

FIGS. 2A–2B are cross-sectional diagrams illustrating the formation of the triple-well structure.

DETAILED DESCRIPTION

Figure 1:
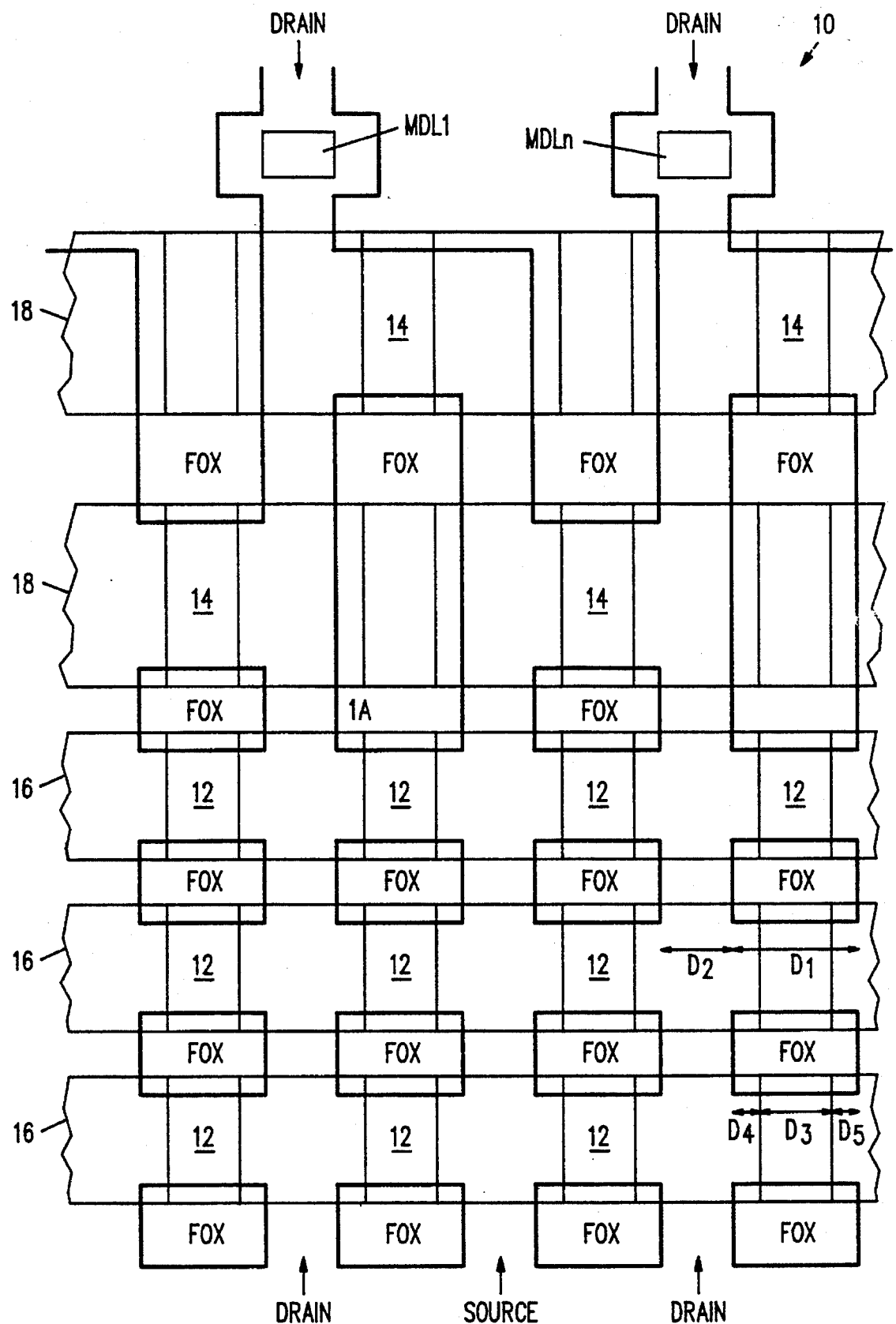
FIG. 1 is a plan view illustrating a portion of a "virtual-ground" flash EPROM array 10.

FIGS. 2–12 show plan and cross-sectional views that illustrate the steps for forming a "virtual-ground" flash electrically programmable read-only-memory (EPROM) in accordance with the present invention. As described above, the length of the field oxide regions in the X direction is defined by the width of the floating gate plus two misalignment widths which assure that the floating gates are formed over a portion of each of the vertically-adjacent field oxide regions even if the floating gates are slightly misaligned.

As described in greater detail below, the present invention eliminates the misalignment widths by utilizing the same stacked etch process to define the width of both the floating gates and the field oxide regions. By eliminating the misalignment widths, the length of the field oxide regions in the X direction, as well as the pitch of the memory cells, can be significantly reduced, thereby substantially increasing the density of the EPROM array.

The process of the present invention, which will be described with respect to a 0.6 micron photolithographic process, begins with the formation of a triple-well structure. FIGS. 2A–2B show cross-sectional diagrams that illustrate the formation of the triple-well structure. As shown in FIG. 2A, the triple-well structure is first formed by growing a layer of first oxide (not shown) approximately 500 Å thick over a semiconductor substrate 200. A P-type implant mask is then formed over the layer of first oxide and patterned to define two P-type implant regions.

Following this, the unmasked areas are implanted with a P-type dopant to form a P-well region 202 and a P-well region 204. As further shown in FIG. 2A, P-well region 202 defines an array portion of the substrate, while P-well region 204 defines a peripheral portion of the substrate. Next, the P-type implant mask is stripped and a thermal drive-in step is performed to further define the P-well regions 202 and 204. The layer of first oxide is then removed.

After the layer of first oxide has been removed, a layer of second oxide (not shown) approximately 500 Å thick is grown over the semiconductor substrate 200. An N-type implant mask is then formed over the layer of second oxide and patterned to define an N-type implant region within P-well 204. Following this, an N-type dopant is implanted into the unmasked areas to define an N-well region 206.

Once N-well region 206 has been formed, the N-type implant mask is stripped and a further drive-in step is performed to further define the N-well region 206 and the P-well regions 202 and 204. Following the drive-in step, the layer of second oxide is removed. The fabrication steps utilized to form the triple-well structure are conventional and well known in the art.

Alternately, as shown in FIG. 2B, P-well 202 can formed in an N-well 208 which, in turn, is formed in a substrate 210 of P-type conductivity. The important feature of the triple-well structure shown in FIGS. 2A and 2B is the provision of a P-well formed in N-type silicon.

After the triple-well structure has been formed, the next step is to set the channel threshold voltages for the to-be-formed memory cells. The threshold voltages are first set by growing a layer of sacrificial oxide (not shown) on the exposed semiconductor substrate 200, the P-wells 202 and 204, and the N-well 206. Following this, a threshold voltage mask is formed over the layer of sacrificial oxide and patterned to protect the periphery.

After the threshold voltage mask has been formed and patterned, the semiconductor substrate 202 underlying the unmasked areas of sacrificial oxide is then implanted with $B_{11}$ at 40 KeV to form an implant concentration of approximately $5 \times 10^{12}/cm^2$. Following this, the threshold voltage mask is stripped and the layer of sacrificial oxide is removed. The fabrication steps utilized to set the channel threshold voltages are conventional and well known in the art.

Figure 3:
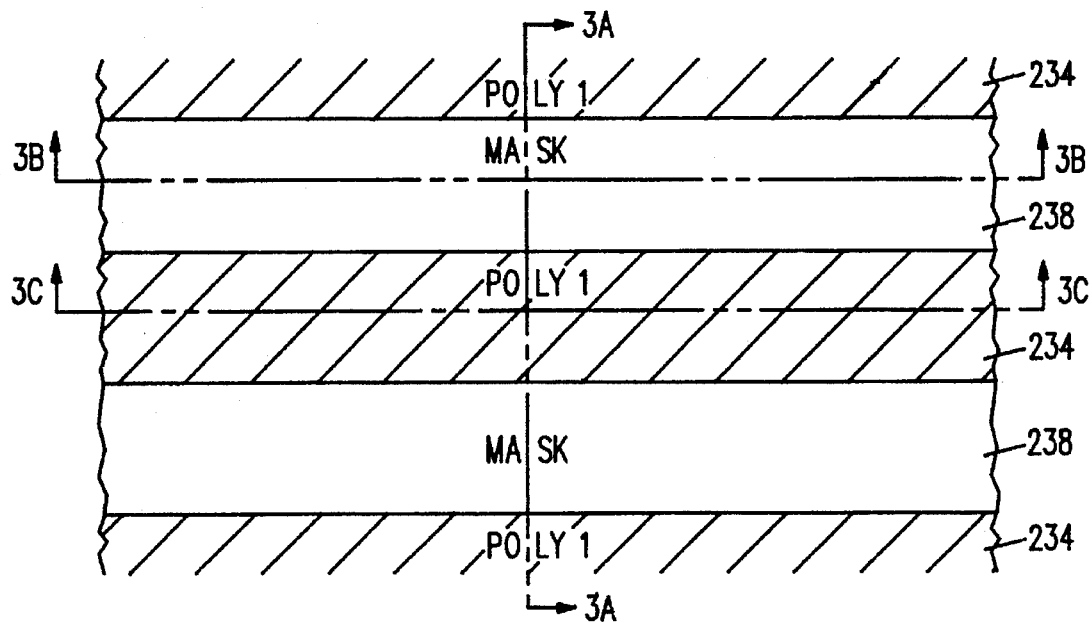
FIG. 3 is a plan view illustrating the formation of a polysilicon/field oxide structure in a portion of the array.
Figure 4A:
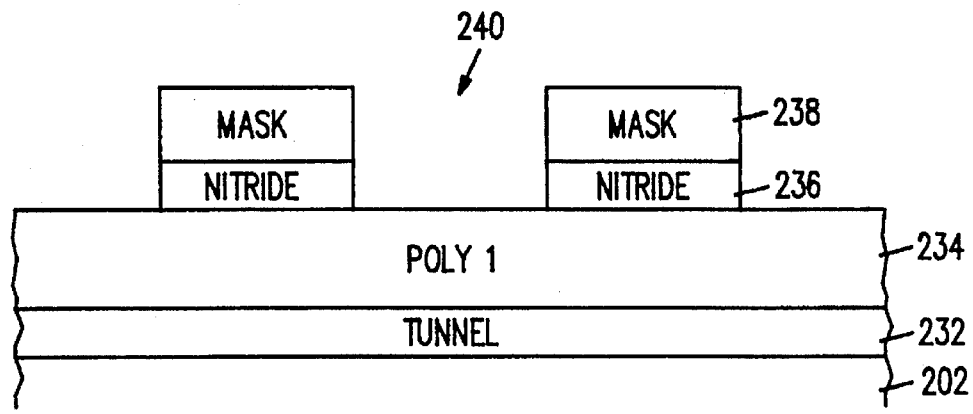
FIGS. 4A–4C are cross-sectional diagrams taken along lines 3A—3A, 3B—3B, and 3C—3C, respectively.
Figure 4B:
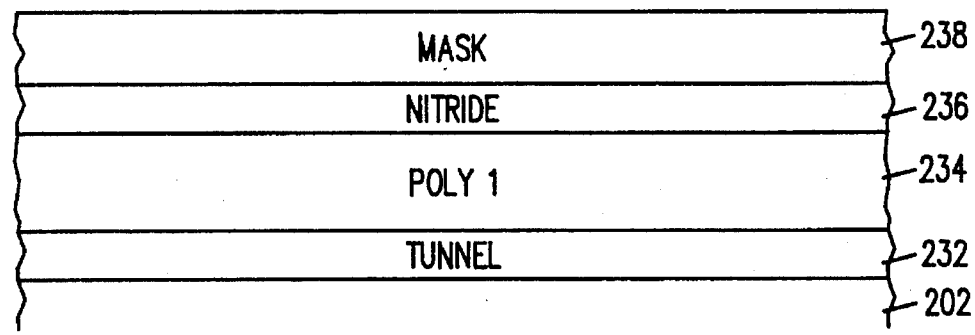
Figure 4C:
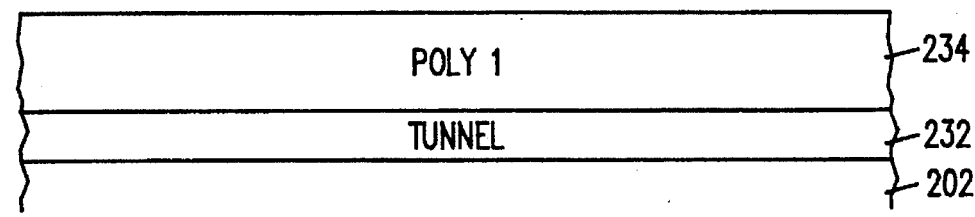

In accordance with the present invention, the next step, after the layer of sacrificial oxide has been removed, is the formation of a polysilicon/field oxide structure. FIG. 3 shows a plan view that illustrates the formation of the polysilicon/field oxide structure in a portion of the array. FIGS. 4A–4C show cross-sectional diagrams taken along lines 3A—3A, 3B—3B, and 3C—3C, respectively.

As shown in FIGS. 4A–4C, once the sacrificial oxide has been removed, a layer of tunnel oxide 232 approximately 100–120 Å thick is grown on the P-well 202, the semiconductor substrate, and the remaining P-well and N-well. Next, a layer of polysilicon (poly1) 234 approximately 1,500 Å thick is deposited over the layer of tunnel oxide 232. The layer of poly1 234 is then doped in a conventional manner.

Next, a layer of nitride 236 is formed on the layer of poly1 234. Following this, a photoresist mask 238 is formed over the layer of nitride 236 and patterned to define spaced-apart parallel strips on the layer of nitride 236. The unmasked layer of nitride 236 is then plasma etched to expose spaced-apart parallel poly1 strips 240.

After the parallel poly1 strips 240 have been exposed, the photoresist mask 238 is stripped. The resulting device is then oxidized until a plurality of field oxide strips FOX STRIP have been grown in the array.

Figure 5:
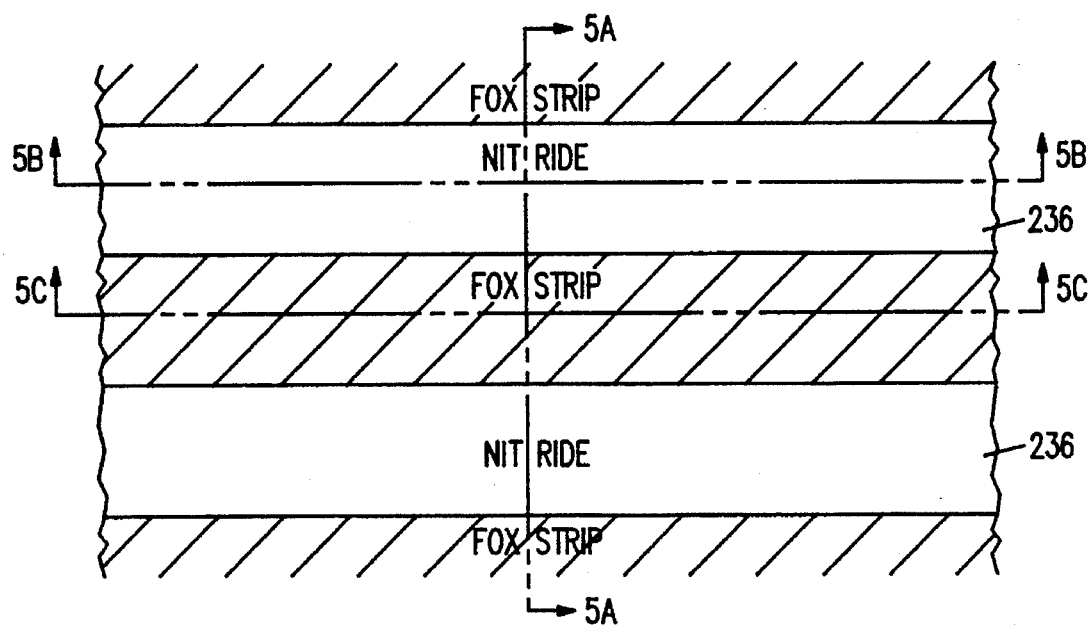
FIG. 5 is a plan view illustrating the structure that results after the field oxide strips FOX STRIP have been formed in a portion of the array.
Figure 6A:
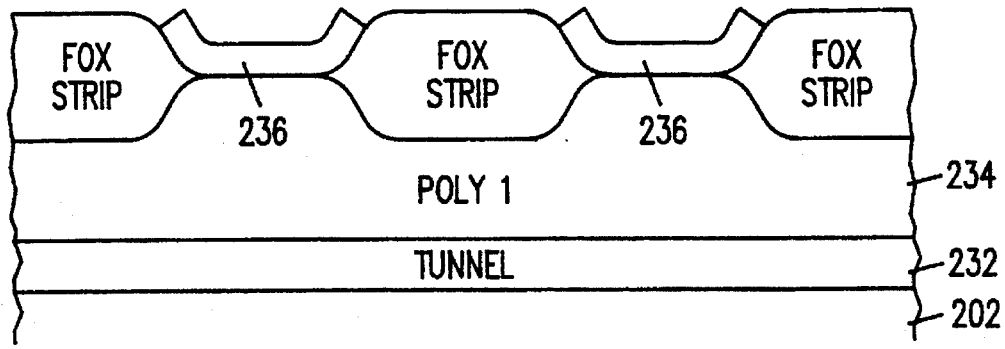
FIGS. 6A–6C are cross sectional diagrams taken along lines 5A—5A, 5B—5B, and 5C—5C, respectively.
Figure 6B:
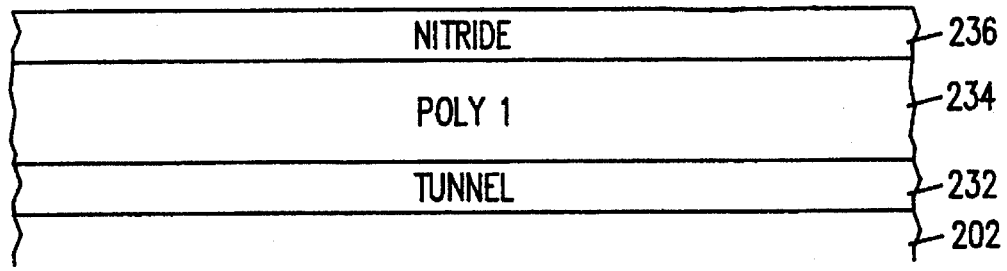
Figure 6C:
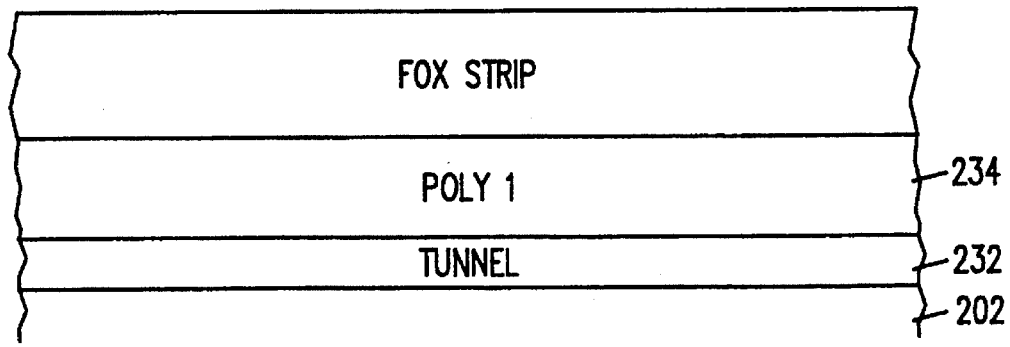

FIG. 5 shows a plan view that illustrates the structure that results after the field oxide strips FOX STRIP have been formed in a portion of the array. FIGS. 6A–6C show cross sectional diagrams taken along lines 5A—5A, 5B—5B, and 5C—5C, respectively.

Figure 7:
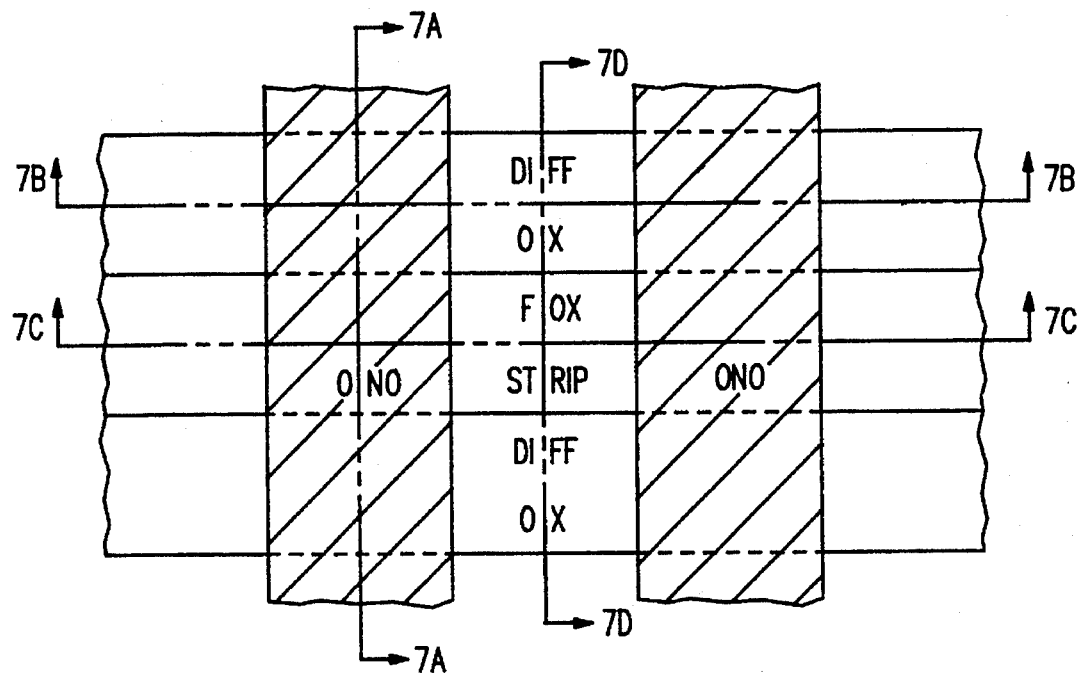
FIG. 7 is a plan view illustrating the initial formation of the floating gates in a portion of the array.

Once the field oxide strips FOX STRIP and the field oxide regions have been formed, the next step is the initial formation of the floating gates of the array. FIG. 7 shows a plan view that illustrates the initial formation of the floating gates in a portion of the array. FIGS. 8A–8D show cross-sectional diagrams taken along lines 7A—7A, 7B—7B, 7C—7C, and 7D—7D, respectively.

As shown in FIGS. 8A–8D, after the field oxide strips FOX STRIP have been formed, the layer of nitride 236 is removed. Next, a layer of polysilicon (poly2) 242 approximately 1,500 Å thick is deposited over the field oxide strips FOX STRIP and the layer of poly1 234 which is exposed between adjacent field oxide strips FOX STRIP. As described in greater detail below, the floating gates of the array will be formed from the combined layers of poly2 242 and poly1 234.

Figure 8A:
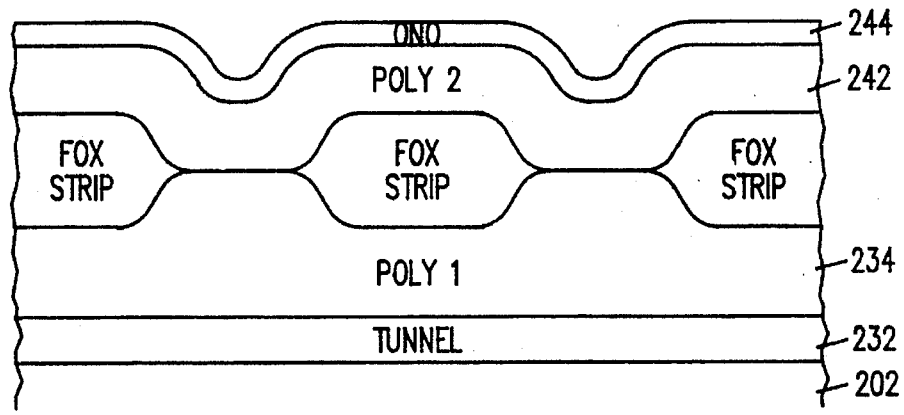
FIGS. 8A–8D show cross-sectional diagrams taken along lines 7A—7A, 7B—7B, 7C—7C, and 7D—7D, respectively.
Figure 8B:
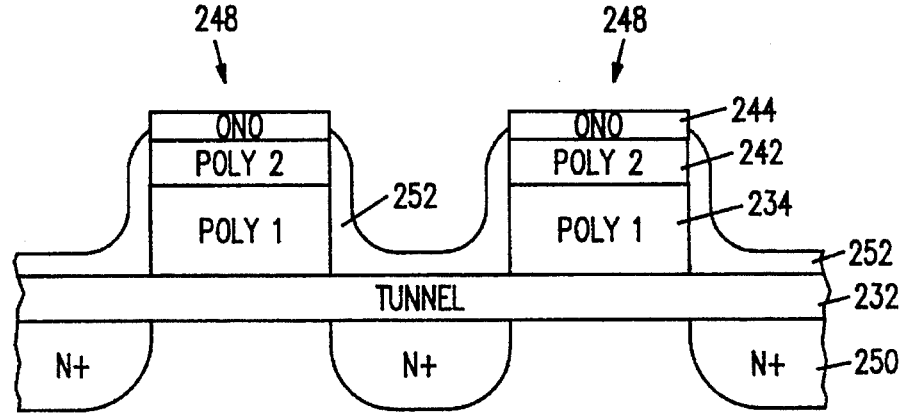

Following this, a composite dielectric layer of oxide/nitride/oxide (ONO) 244 is formed on the layer of poly2 242. After the layer of ONO 244 has been formed, a photoresist mask (not shown) is formed over the layer of ONO 244 and patterned to define spaced-apart parallel strips. The unmasked layer of ONO 244 and underlying layers of poly2/poly1 are then plasma etched to form spaced-apart parallel ONO/poly2/poly1 strips 248. As a result of this etching step, as shown in FIGS. 8B and 8D, a portion of the layer of tunnel oxide 232 is exposed between each pair of strips 248.

Figure 8C:
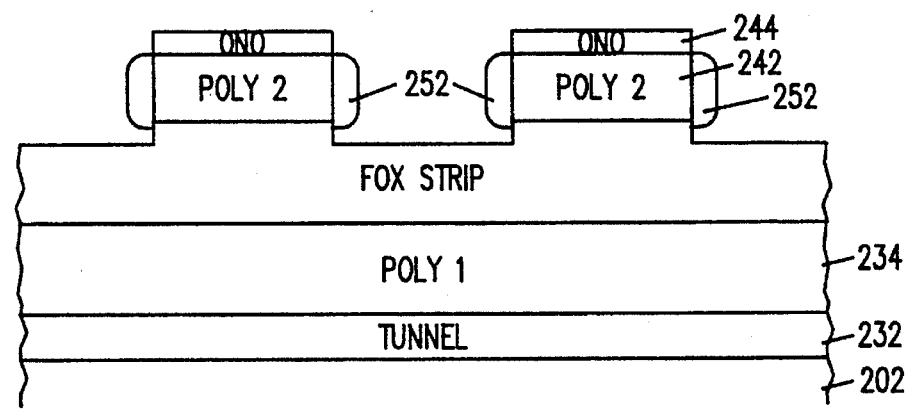
Figure 8D:
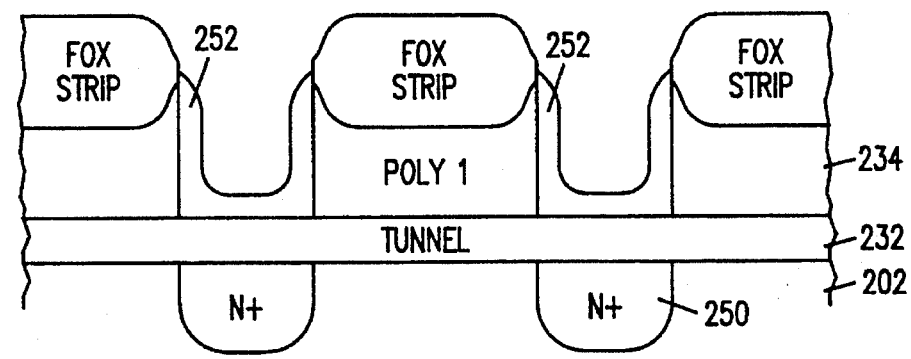
Figure 10A:
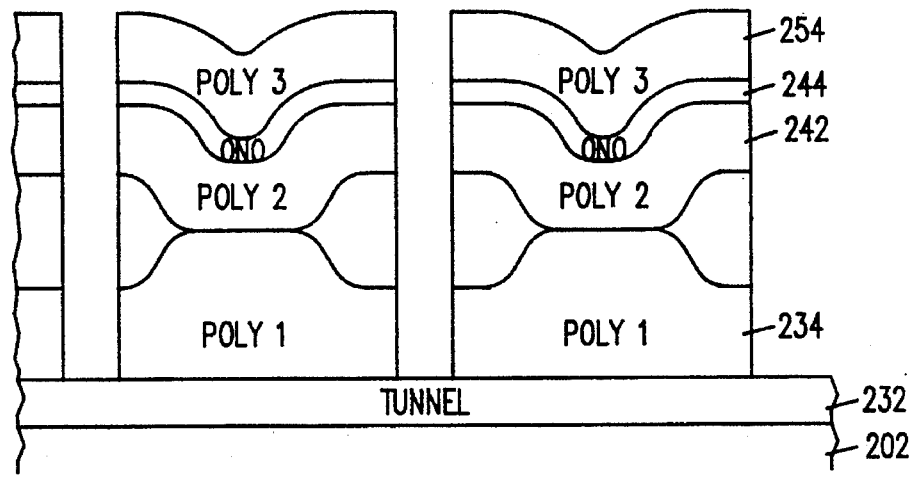
FIGS. 10A–10D show cross-sectional diagrams taken along lines 9A—9A, 9B—9B, 9C—9C, and 9D—9D, respectively.
Figure 10B:
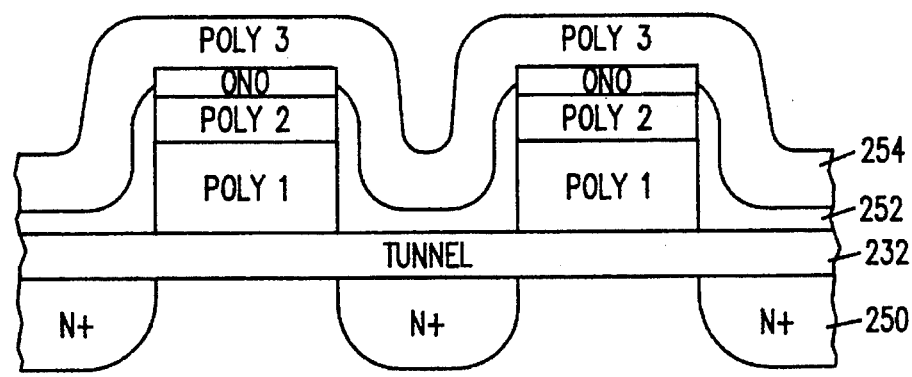
Figure 10C:
Figure 10D:
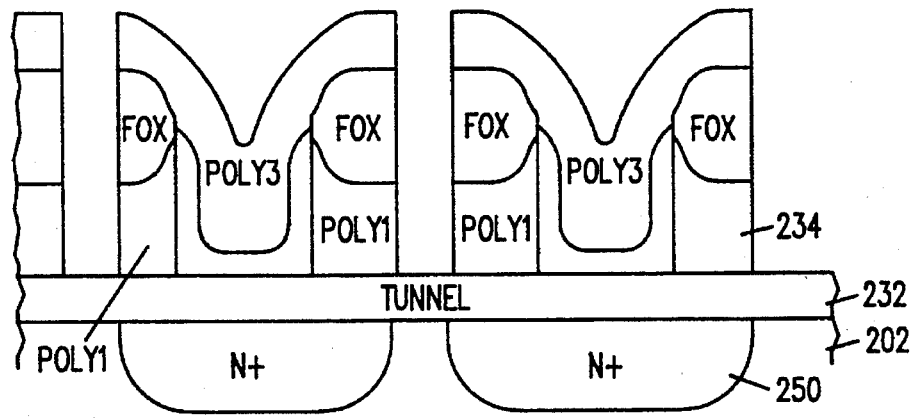

Thus, in accordance with the present invention and as shown in FIG. 8C, since the strips of ONO/poly2 are formed over continuous strips of field oxide, the misalignment widths described above can be eliminated, thereby substantially reducing the pitch of the cells in the X direction.

After the parallel strips 248 have been formed, arsenic is implanted into the substrate 202 through the layer of tunnel oxide 232 to define $N^+$ source and drain bit regions 250. The photoresist mask is then stripped and a layer of differential oxide 252 is grown over the $N^+$ source and drain bit regions 250 and along the sides of the strips 248.

At this point, a plurality of MOS transistors are formed in the periphery. The typical flash EPROM includes a number of MOS transistors that function, for example, as current sense detectors and address decoders. To form the peripheral MOS devices, a protect array mask (not shown) is formed over the array portion of the substrate.

Following the formation of the protect array mask, the layer of ONO, the layer of poly2, the layer of poly1, and the layer of tunnel oxide are etched from the periphery. Next, the protect array mask is stripped. Once the protect array mask has been removed, a layer of gate oxide (not shown) approximately 150–200 Å thick is grown on the P-type semiconductor substrate in the periphery. After the layer of gate oxide has been grown, the next step is to set the channel threshold voltages for each of the to be formed MOS transistors in the periphery. The threshold voltages are set by forming and patterning a threshold mask, and then implanting a P-type dopant through the unmasked layer of gate oxide. Following this, the threshold voltage mask is stripped.

Figure 9:
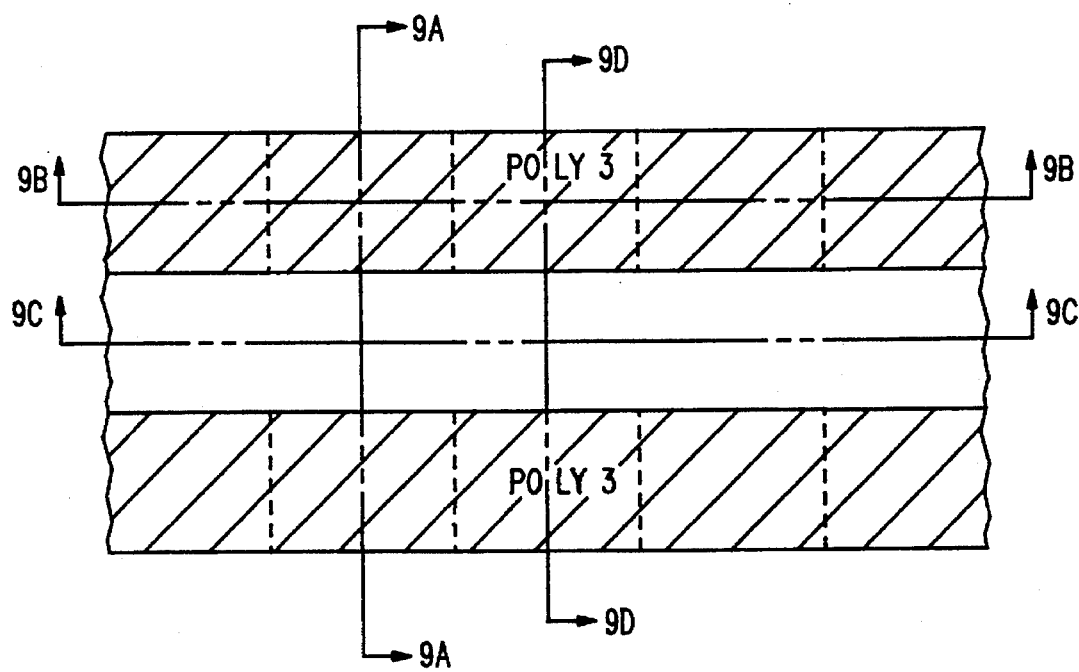
FIG. 9 is a plan view illustrating the formation of the word lines in a portion of the array.

After the threshold voltages of the peripheral MOS devices have been set, the next step is to form the word lines and access transistor lines in the array, and gate electrodes of the MOS transistors in the periphery. FIG. 9 shows a plan view that illustrates the formation of the word lines in a portion of the array. FIGS. 10A–10D show cross-sectional diagrams taken along lines 9A—9A, 9B—9B, 9C—9C, and 9D—9D, respectively.

As shown in FIGS. 10A–10D, once the threshold voltages are set, a layer of third polysilicon (poly3) 254 approximately 1,500 Å is deposited over the surface of the entire device and doped in a conventional manner. In the preferred embodiment, this is followed by the deposition of an overlying layer of tungsten silicide (not shown) approximately 2,000 Å thick. As described in greater detail below, the control gates of the cells will be formed by the portion of the composite layer of tungsten silicide/poly3 that is formed over the floating gates.

A word line mask (not shown) is then formed over the tungsten silicide/poly3 composite and patterned to define a series of word lines and access select lines in the array, and the gate electrodes of the peripheral MOS devices. Following this, the tungsten silicide/poly3 composite is etched until the unmasked layers of tungsten silicide and poly3 254 have been removed. It is noted that the access transistors are flash EPROM cells which have a larger width than the array flash EPROM cells. This allows the access transistors to drive larger currents than the array cells.

Once the tungsten silicide/poly3 composite has been etched, the word line mask is UV-hardened and a self-aligned etch (SAE) mask is formed so that the overlying tungsten silicide/poly3 composite can be used as a mask for a self-aligned etch of the ONO/poly2/oxide/poly1 composite. This then is followed by a stacked etch of the ONO/poly2/oxide/poly1 composite to define each of the memory cells and access transistors of the array. Following this, the SAE mask is stripped.

Figure 11:
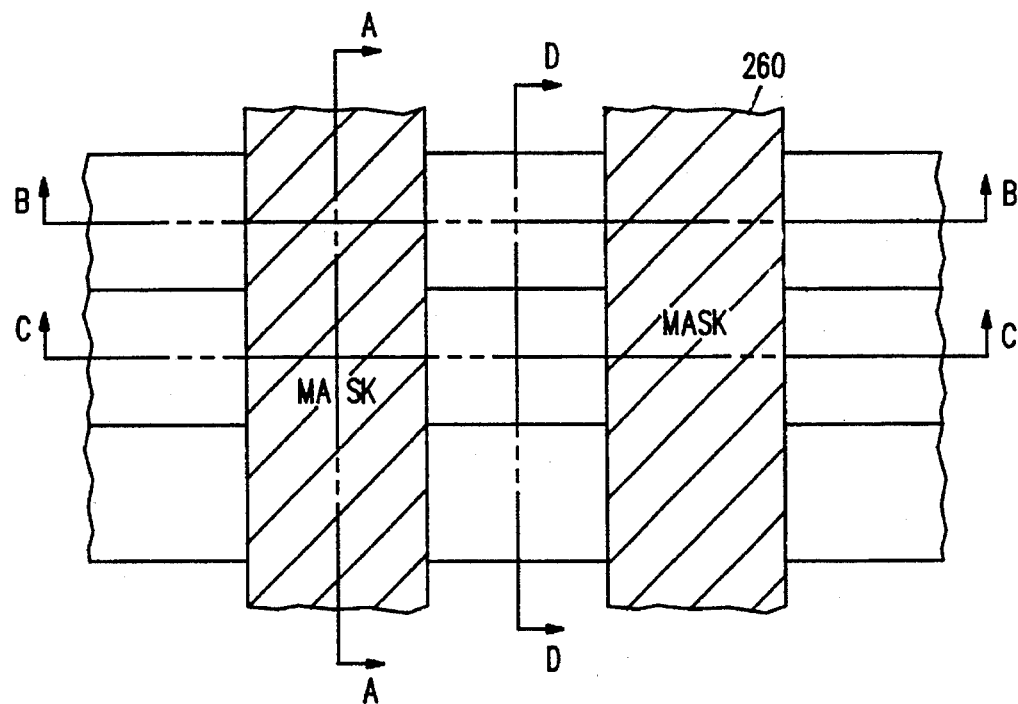
FIG. 11 is a plan view illustrating the formation of the bit lines in a portion of the array.
Figure 12A:
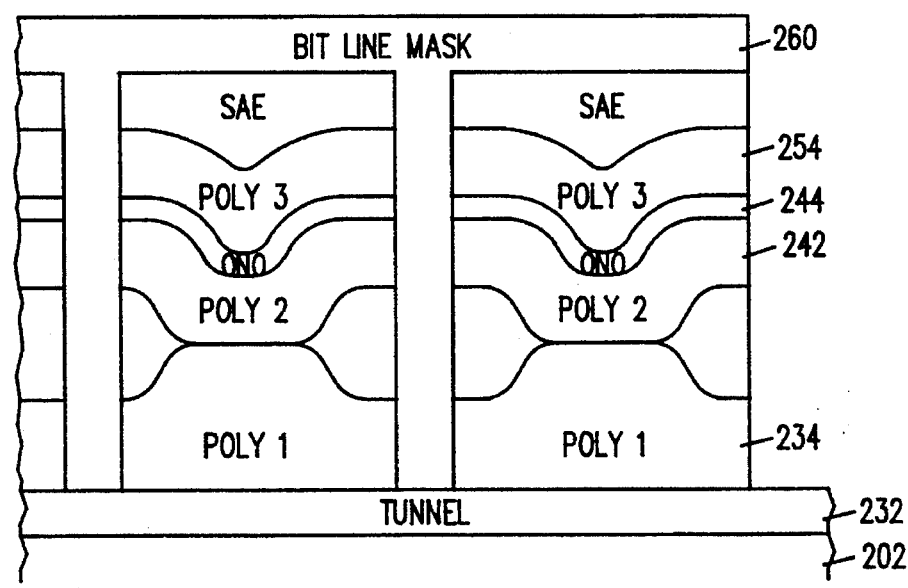
FIGS. 12A–12D show cross-sectional diagrams taken along lines 11A—11A, 11B—11B, 11C—11C, and 11D—11D, respectively.
Figure 12B:
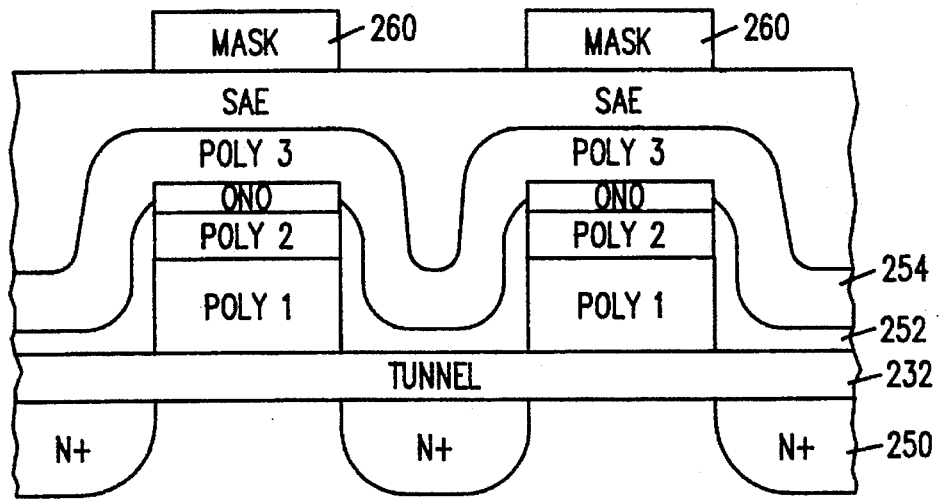
Figure 12C:
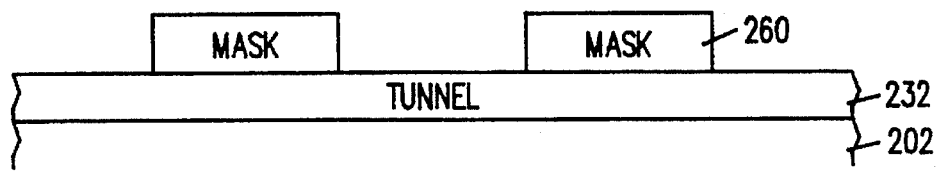
Figure 12D:
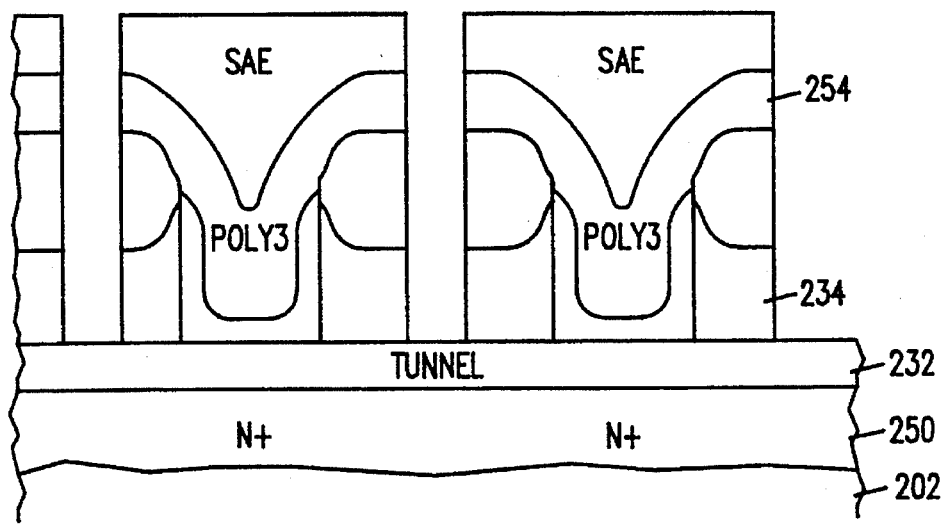

The next step, after the SAE mask has been removed, is the formation of the bit lines. FIG. 11 shows a plan view that illustrates the formation of the bit lines in a portion of the array. FIGS. 12A–12D show cross-sectional diagrams taken along lines 11A—11A, 11B—11B, 11C—11C, and 11D—11D, respectively.

As shown in FIGS. 12A–12D, after the self-aligned etch of the ONO/poly2/oxide/poly1 composite, a source/drain mask 260 is formed and patterned to define the N+ bit lines in the array and the N+ source and drain regions of the MOS devices in the periphery. Once the source/drain mask 260 has been formed, the P-type semiconductor substrates 202 and 204 (see FIG. 2A) underlying the unmasked areas are implanted with arsenic through the layer of tunnel oxide 232 and gate oxide to a depth of 0.2 to 0.3 microns. The source/drain mask is then stripped. Next, the device is oxidized to further diffuse the implant and to form a layer of oxide over the bit lines in the array and the source/drain regions in the periphery. Following this, the process follows conventional steps.

Figure 13:
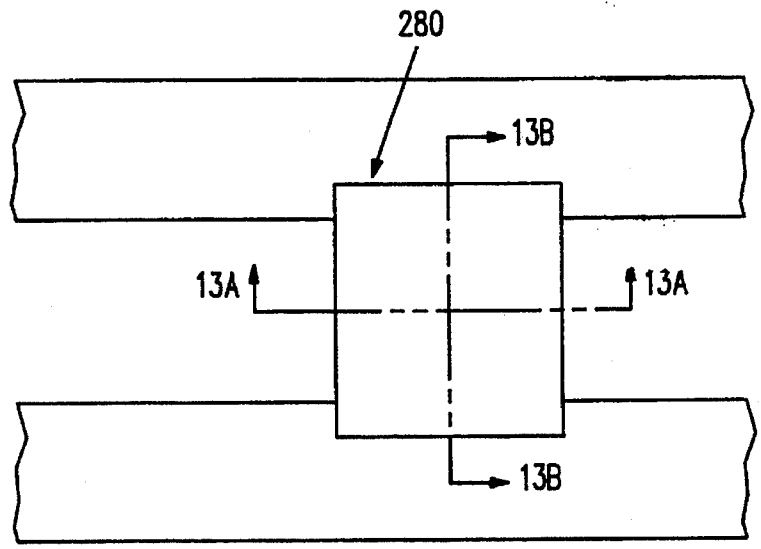
FIG. 13 is a plan view illustrating a portion a single memory cell 280 which has been formed in accordance with the present invention.
Figure 14A:
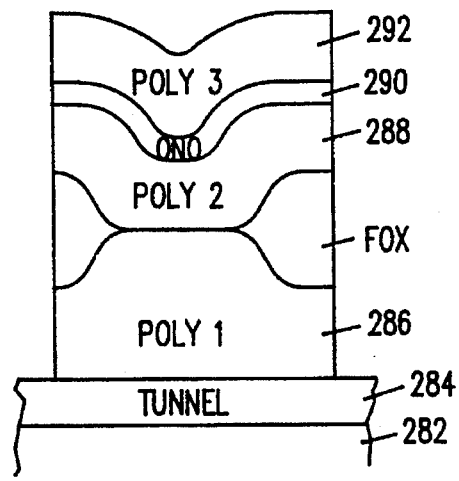
FIGS. 14A and 14B show cross-sectional diagrams taken along lines 13A—13A and 13B—13B, respectively.
Figure 14B:
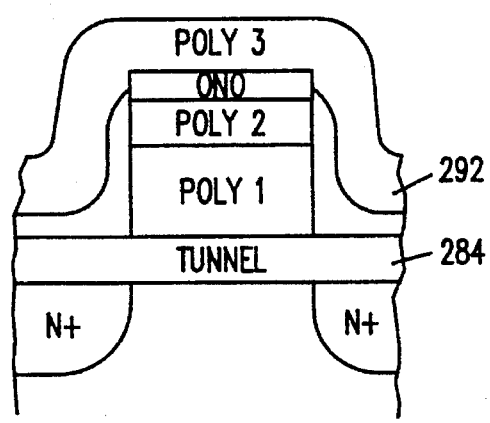
Figure 15:
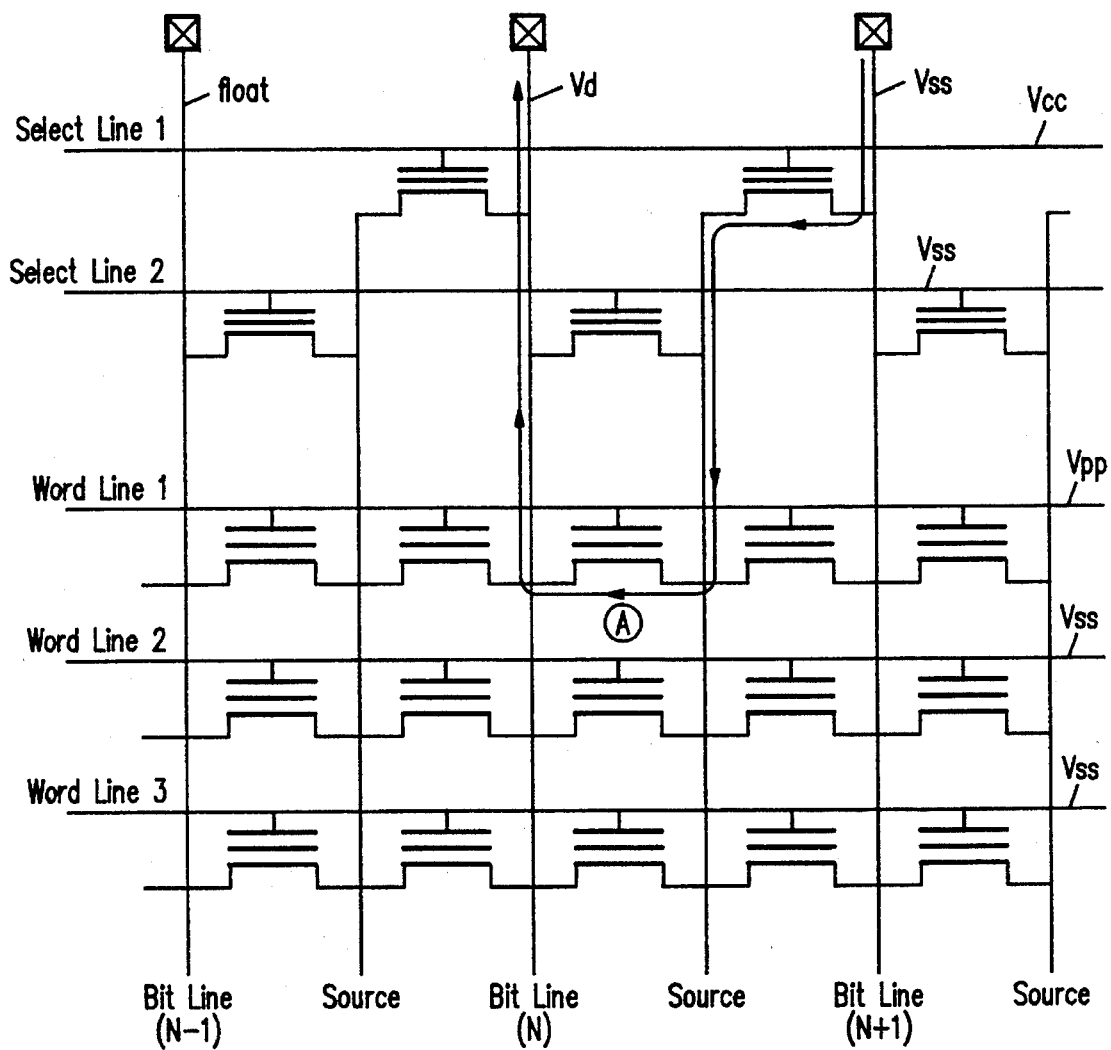
FIG. 15 is a schematic diagram illustrating how a cell is programmed.

FIG. 13 shows a plan view that illustrates a portion a single memory cell 280 which has been formed in accordance with the present invention. FIGS. 14A and 14B show cross-sectional diagrams taken along lines 13A—13A and 13B—13B, respectively. As shown in FIGS. 14 and 15, the memory cell 280 of the present invention includes a substrate 282, a layer of first dielectric material (tunnel oxide) 284 which is formed on the substrate 282, a layer of first conductive material (poly1) 286 which is formed on the layer of first dielectric material 284, and pair of spaced-apart field oxide regions FOX which are formed in the layer of first conductive material 286. As shown in FIG. 14A, a poly1 contact region is defined between the field oxide regions FOX.

As further shown in FIGS. 14 and 15, each cell 280 also includes a layer of second conductive material (poly2) 288 which is formed over a portion of each of the field oxide regions FOX and the layer of first conductive material 286 which is defined by the poly1 contact region, a layer of second dielectric material (ONO) 290 which is formed over the layer of second conductive material 288, and a layer of third conductive material 292 which is formed over the layer of second dielectric material 290.

FIG. 15 shows a schematic diagram that illustrates how a cell is programmed. As shown in FIG. 15, the above-described array is programmed in the conventional AMG manner. That is, to program cell A, the drain bit line N of cell A held at an intermediate voltage Vd (approx 5–7 V), source bit line N+1 is held at ground, and source bit line N−1 is allowed to float. Select line 1 is biased to the supply voltage Vcc (approx. 5 V) and select line 2 is held at ground. The word line WC1 associated with cell A is taken to the programming voltage Vpp (approx. 12–13 V0, while the remaining word lines (WC2/WL3) are grounded. These bias conditions result in current flow as shown by the arrow in FIG. 15, which results in electron injection from the drain of cell A to the floating gate of cell A, thus programming cell A.

In the above-described flash array, erase is achieved using a "channel erase". As shown in FIGS. 14A–14B, this requires the formation of thin tunnel oxide about 100–120 Å thick beneath the floating gates of the EPROM cells. To compensate for the low coupling ratio induced by the thinner tunnel oxide under the floating gate, the floating gate includes poly1 "extensions" over the field oxide regions (FOX) in the array. In addition, the low coupling ratio can also be compensated by decreasing the thickness of the layer of ONO.

Figure 16:
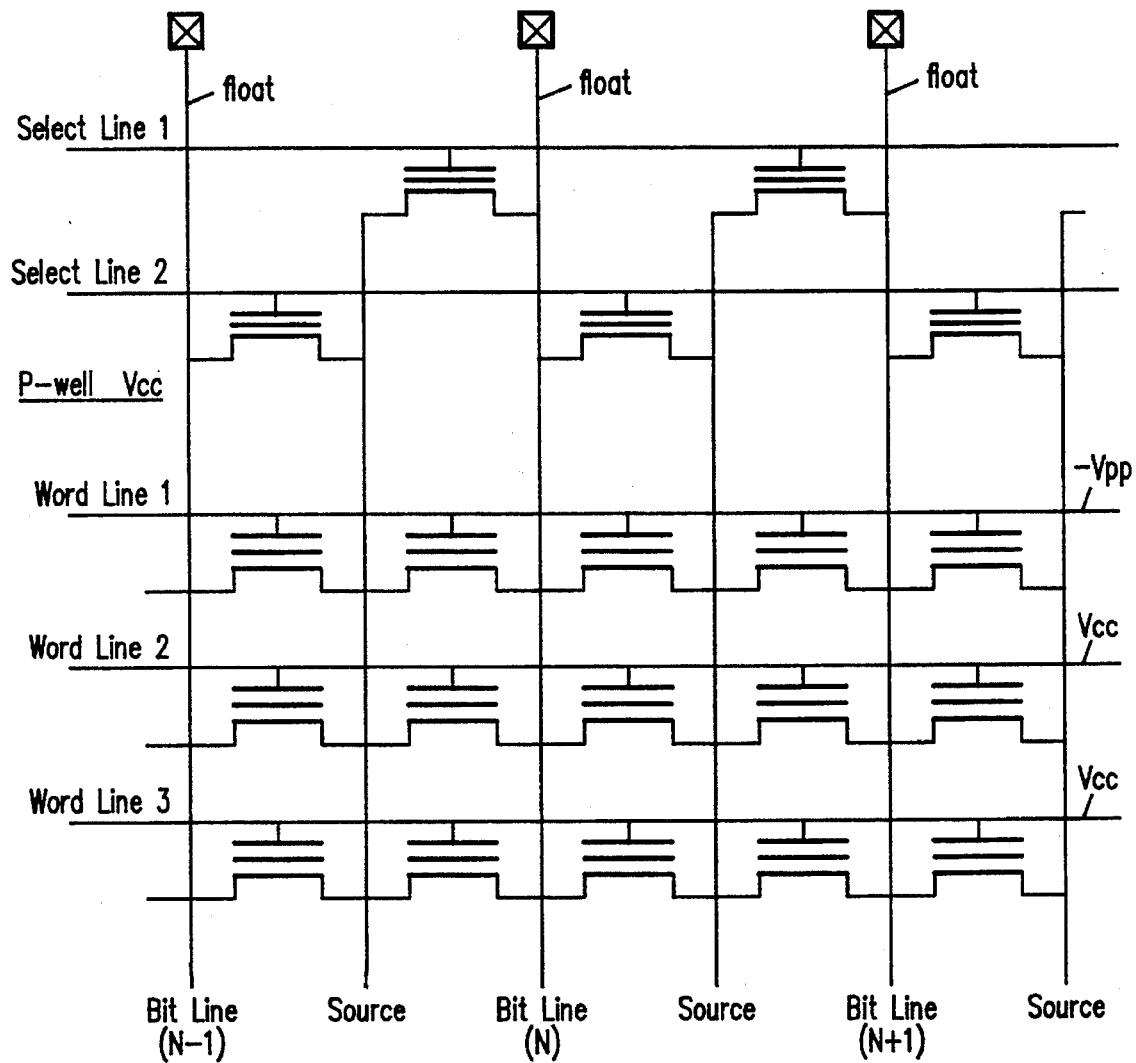
FIG. 16 is a schematic diagram illustrating the bias conditions for erasing the cells on a selected word line.
Figure 17:
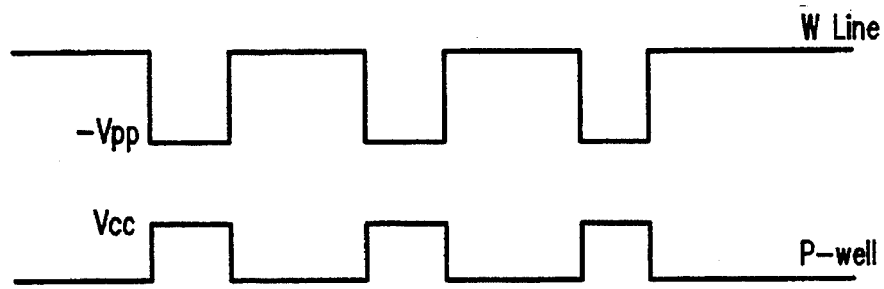
FIG. 17 is a timing diagram illustrating the waveforms of the selected word line voltage and of the P-well voltage for erasing the cells on the selected word line.
Figure 18:
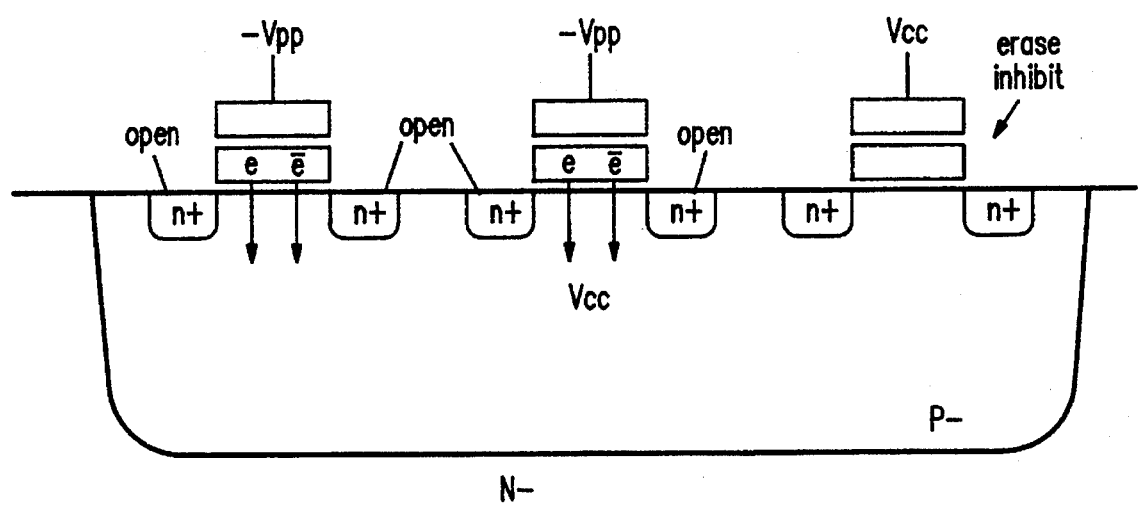
FIG. 18 is a cross-sectional diagram illustrating the erase mechanism.

FIG. 16 shows a schematic diagram that illustrates the bias conditions for erasing the cells on a selected word line. FIG. 17 shows a timing diagram that illustrates the waveforms of the selected word line voltage and of the P-well voltage for erasing the cells on the selected word line. FIG. 18 shows a crosssectional diagram that illustrates the erase mechanism.

As shown in FIGS. 16–18, in the "channel erase" operation, a high negative voltage −Vpp (approx. −12 V to −13 V) is applied to the word line of each row in the array selected for erasure. A positive voltage Vcc (approx. 5V) is applied to the channel area, i.e. to the p-well. The source and drain bit lines are kept open, i.e. floating. The remaining rows are "erase inhibited" by applying the supply voltage Vcc to their associated word lines. These bias conditions cause Fowler-Nordheim current to flow from the floating gates of the cells in the selected rows to the p-well. The erase operation requires low current, thus allowing the use of a high voltage negative charge pump. Furthermore, the band-to-band tunneling and the large erase currents inherent to the conventional source erase operation are eliminated, suggesting a larger cycling endurance for the channel erase device.

As stated above, in a preferred embodiment, the select transistors are flash cells with a $W \geq 2$ times the W of a cell in the array in order to pull down Vss on the intermediate node.

It should be understood that various alternatives to the embodiment of the invention described herein may be employed in practicing the invention. It is intended that the following claims define the scope of the invention and that methods and structures within the scope of these claims and their equivalents be covered thereby.

What is claimed is:

1. A non-volatile memory cell formed in a semiconductor substrate for storing data, the memory cell comprising:

a layer of first insulation material formed on and in contact with the substrate;

a layer of first conductive material formed on and in contact with the layer of first insulation material, the layer of first conductive material having a top surface;

a first layer of second insulation material formed on and in contact with the top surface of the layer of first conductive material;

a second layer of second insulation material formed on and in contact with the top surface of the layer of first conductive material and spaced apart from the first layer of second insulation material;

a layer of second conductive material formed on and in contact with the first and second layers of second insulation material and the layer of first conductive material;

a layer of third insulation material formed over the layer of second conductive material; and a layer of third conductive material formed over the layer of third insulation material.

2. The memory cell of claim 1 wherein the first conductive material and the second conductive material form a floating gate.

3. The memory cell of claim 1 wherein the layer of first conductive material has a first side and a second side, the layer of second conductive material has a first side and a second side, the first layer of second insulation material has an outer side, and the second layer of second insulation material has an outer side, and wherein the first side of the layer of first conductive material, the first side of the layer of second conductive material, and the outer side of the first layer of second insulation material are substantially coplanar.

4. The memory cell of claim 3 wherein the second side of the layer of first conductive material, the second side of the layer of second conductive material, and the outer side of the second layer of second insulation material are substantially coplanar.

5. The memory cell of claim 4 wherein the layer of third insulation material has a first side and a second side, and wherein the first side of the layer of first conductive material, the first side of the layer of second conductive material, the outer side of the first layer of second insulation material, and the first side of the layer of third insulation material are substantially coplanar.

6. The memory cell of claim 5 wherein the second side of the layer of first conductive material, the second side of the layer of second conductive material, the outer side of the second layer of second insulation material, and the second side of the layer of third insulation material are substantially coplanar.

7. A non-volatile memory cell for storing data formed in a semiconductor substrate having a first conductivity, the memory cell comprising:

a layer of first insulation material formed on and in contact with the substrate;

a floating gate formed on and in contact with the layer of first insulation material, the floating gate having a first side, a second side, a first opening formed in the first side, and a second opening formed in the second side;

a layer of second insulation material formed in the first opening of the floating gate;

a layer of third insulation material formed in the second opening of the floating gate;

a layer of fourth insulation material formed on and in contact with the floating gate; and a control gate formed on and in contact with the layer of fourth insulation material.

8. The memory cell of claim 7 wherein the layer of second insulation material formed in the first opening has an exterior side that is substantially coplanar with the first side of the floating gate.

9. The memory cell of claim 8 wherein the layer of third insulation material formed in the second opening has an exterior side that is substantially coplanar with the second side of the floating gate.

10. The memory cell of claim 9 wherein the layer of fourth insulation material has a first side and a second side, and the control gate has a first side and a second side, and wherein the exterior side of the second insulation material formed in the first opening, the first side of the floating gate, the first side of the layer of fourth insulation material, and the first side of the control gate are substantially coplanar.

11. The memory cell of claim 10 wherein the exterior side of the third insulation material formed in the second opening, the second side of the floating gate, the second side of the layer of fourth insulation material, and the second side of the control gate are substantially coplanar.

* * * * *